(12) United States Patent
Noujeim

(10) Patent No.: US 7,746,052 B2
(45) Date of Patent: Jun. 29, 2010

(54) APPARATUS FOR EXTENDING THE BANDWIDTH OF A SPECTRUM ANALYZER

(75) Inventor: Karam Michael Noujeim, Sunnyvale, CA (US)

(73) Assignee: Anritsu Company, Morgan Hill, CA (US)

( * ) Notice: Subject to any disclaimer, the term of this patent is extended or adjusted under 35 U.S.C. 154(b) by 349 days.

(21) Appl. No.: 11/873,169

(22) Filed: Oct. 16, 2007

(65) Prior Publication Data

US 2009/0098847 A1    Apr. 16, 2009

(51) Int. Cl.
*G01R 23/00* (2006.01)
(52) U.S. Cl. ............... 324/76.19; 324/76.28; 324/76.29
(58) Field of Classification Search ........................ None
See application file for complete search history.

(56) References Cited

U.S. PATENT DOCUMENTS

| | | | | |
|---|---|---|---|---|
| 3,913,013 | A * | 10/1975 | Barley et al. ............. | 324/76.23 |
| 6,636,816 | B1 * | 10/2003 | Dvorak et al. ................. | 702/66 |
| 7,299,166 | B1 * | 11/2007 | Liu et al. ...................... | 703/13 |
| 2008/0095271 | A1 * | 4/2008 | He et al. ...................... | 375/316 |
| 2008/0096489 | A1 * | 4/2008 | He et al. ...................... | 455/75 |

OTHER PUBLICATIONS

Agilent Technologies, Agilent Spectrum Analysis Basics, Application Note 150, Nov. 30, 2000, pp. 1-64.
Agilent Technologies, User's Guide 11970 Series Harmonic Mixers, Oct. 2003, pp. 1-78.
Spectrum Analyzer Mixers and Diplexers, Receiver Products, Section 2, QuinStar Technology, Inc., Torrance, CA, pp. 47-48.

* cited by examiner

*Primary Examiner*—Thomas Valone
(74) *Attorney, Agent, or Firm*—Fliesler Meyer LLP

(57) ABSTRACT

A spectrum analyzer is provided with frequency-scalable circuit architectures that extend the bandwidth of the spectrum analyzer using an array of couplers. The array of couplers is distributed along the RF signal path at one end, and interfaced to one or more frequency-translation devices such as mixers or samplers at the other. In a first architecture, a single mixer is employed with an LO signal applied to one input and coupler outputs providing RF signals to another input, with switching controlled to select one coupler's RF output to provide to the mixer. In a second architecture, a separate mixer is used, one for each coupler RF signal, with switches selecting one of the mixer IF outputs to select a desired output frequency. Both the first and second embodiments eliminate switching and its associated loss and frequency limitations from the main RF signal path to enable wideband high-dynamic-range spectrum analysis.

21 Claims, 3 Drawing Sheets

US 7,746,052 B2

APPARATUS FOR EXTENDING THE BANDWIDTH OF A SPECTRUM ANALYZER

BACKGROUND

1. Technical Field

The present invention relates to components used in broadband spectrum analyzers. More particularly the present invention relates to circuitry for extending the frequency range of a spectrum analyzer into the millimeter-wave spectrum.

2. Related Art

Currently available broadband spectrum analyzer architectures make use of switched filters along the RF signal path as a means of implementing frequency-band pre-selection. FIG. 1 provides circuitry illustrating the use of switched filters to allow frequency-band pre-selection in a broadband spectrum analyzer. The circuitry includes a low-frequency spectrum analyzer (LFSA) 2. The LFSA 2 receives RF and IF signal inputs. In low-frequency mode, the RF signal input is connected directly to the LFSA 2 by means of switch 7. In high-frequency mode, switches 6 and 7 are connected to one of bandpass filters 4 to provide an RF signal to mixer 8. The IF output of mixer 8 is then provided as a second RF input to LFSA 2.

As the frequency range of the architectures using switched filters illustrated in FIG. 1 extends into the millimeter-wave spectrum, frequency-dependent RF-switch limitations occur. Switching limitations such as increased loss and reduced bandwidth begin to take their toll on spectrum analyzer performance. The direct results of these limitations are a decrease in the dynamic range of the instrument, and severe boundaries on its operating frequency bandwidth.

In order to overcome the later limitation, techniques using external mixers have been developed to extend the frequency range of the spectrum analyzer. FIG. 2 illustrates such an external mixer configuration, also known as an external frequency-range extension. The circuitry includes a LFSA 2 that receives an RF signal directly in a low-frequency mode, and receives the RF signal through an external mixer 12 in a high-frequency mode. In low-frequency mode, the RF signal input is connected directly or by means of switch 9 to a low frequency RF input of the LFSA 2. In high-frequency mode, the switch 9 directs the RF signal through a frequency range extender 10 that includes mixer 12. The mixer 12 output provides a second RF input to the LFSA 2. The LO input signal to the mixer 12 is generated inside the LFSA 2.

One drawback to using the technique illustrated in FIG. 2 is that measurement must typically be performed manually within separate high-frequency bands each requiring an external frequency range extender. Manual measurements are necessary due to the fact that typically the extension mixer 12 covers only a portion of the high-frequency band and must be replaced with different extension mixers for covering other bands. In addition, the lack of filtering on the IF port of the external mixers adds to the tediousness of the measurements.

It would be desirable to extend the operating frequency range of a LFSA without the drawbacks and the limitations of the frequency dependent RF-switch of FIG. 1, or the need to perform measurements manually within separate frequency bands as when an external mixer of FIG. 2 is used.

SUMMARY

Embodiments of the present invention provide frequency-scalable architectures that extend the bandwidth of spectrum analyzers while removing the limitations imposed by the presence of switches, or external mixers along the RF signal path. This is made possible by frequency multiplexing the various frequency bands using a chain of couplers in the RF path with lengths chosen to yield maximum coupling at the band centers, along with one or more mixers.

Two circuit embodiments provide frequency-scalable architectures for extending the operating bandwidth of low-frequency spectrum analyzers. In both embodiments, frequency extension is achieved by means of an array of couplers distributed along the RF signal path at one end, and interfaced to one or more frequency-translation devices such as mixers or samplers at the other. In the first architecture embodiment, a single mixer is employed with an LO signal applied to one input and the output of one of the couplers providing RF signals to the other input by means of controlled switching. In a second architecture embodiment, multiple mixers are used, one for each RF coupler signal, with switches selecting one of the mixer IF outputs to select a desired RF frequency range for down conversion.

Unlike existing spectrum analyzers in which frequency-band pre-selection is achieved by means of switches along the main RF signal path, the architectures of embodiments of the present invention employ coupler-based multiplexing. This approach results in the elimination of switching and its associated loss and frequency limitations from the main RF signal path, and enables wideband high-dynamic-range spectrum analysis.

BRIEF DESCRIPTION OF THE DRAWINGS

Further details of the present invention are explained with the help of the attached drawings in which.

DETAILED DESCRIPTION

Figure 1:
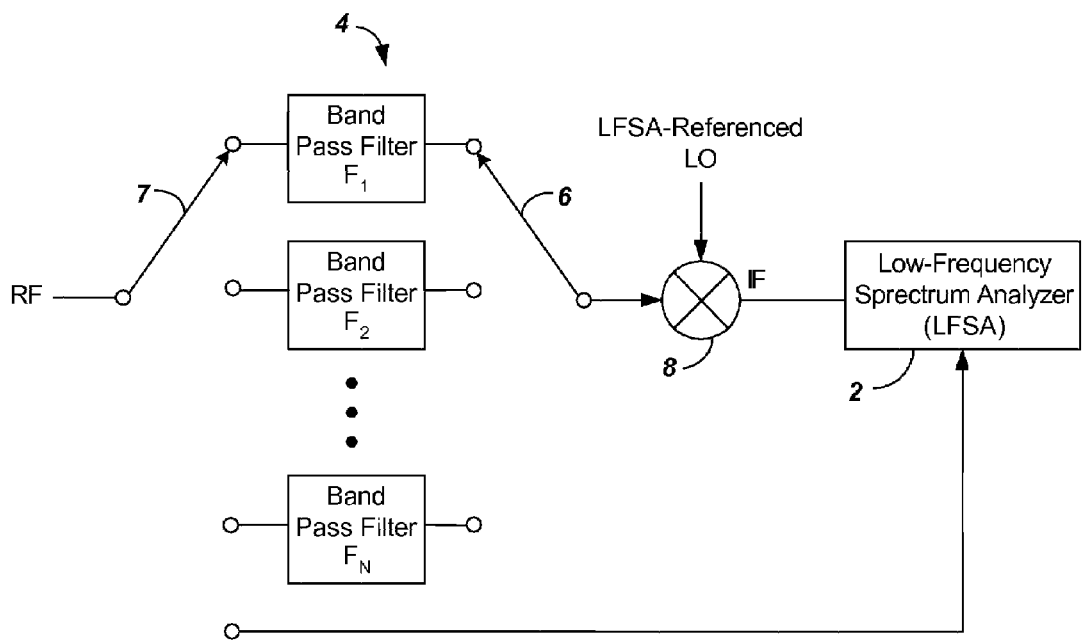
FIG. 1 illustrates the use of switched filters to allow frequency band pre-selection in a broadband spectrum analyzer.
Figure 2:
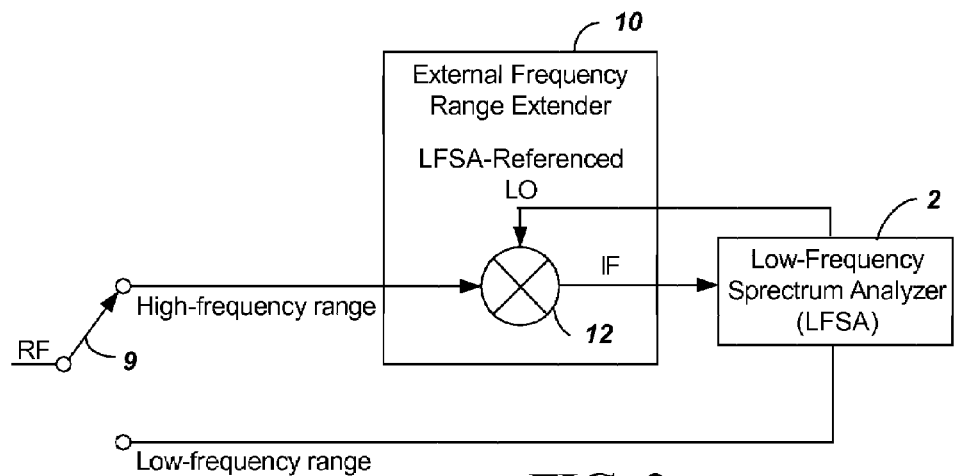
FIG. 2 illustrates an external mixer configuration used to extend the frequency range of a spectrum analyzer.
Figure 3:
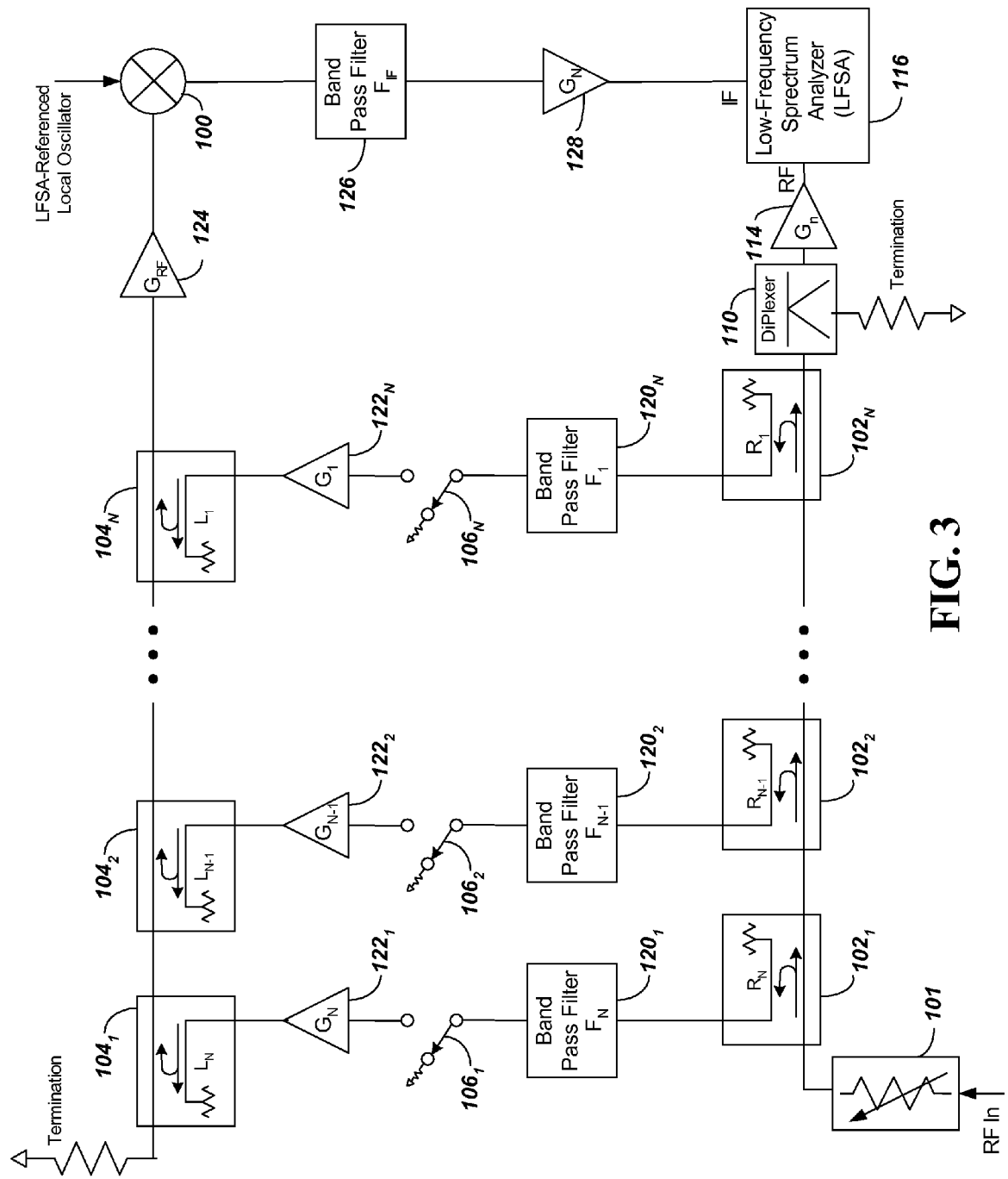
FIG. 3 shows circuitry for extending the bandwidth of a low frequency spectrum analyzer (LFSA) according to an embodiment of the present invention using an array of couplers tapped onto the RF signal path, along with a single frequency translation device for translating the coupler outputs to provide to a LFSA.

FIG. 3 shows circuitry for extending the bandwidth of a low-frequency spectrum analyzer according to one embodiment of the present invention. The circuit of FIG. 3 uses an array of couplers $102_{1...N}$ arranged along the RF signal path. The frequency spectrum of the RF signal is split into N+1 bands corresponding to the N couplers $102_{1...N}$ and the low-frequency band of the LFSA 116. The frequency range of each coupler $102_{1...N}$ corresponds to a different one of the N+1 bands with some overlap, as illustrated by the respective symbol $R_{1...N}$. A $0^{th}$ band corresponds to the frequency range of the LFSA 116, the $0^{th}$ band being uncommon to all the couplers $102_{1...N}$ while the $i^{th}$ (i=1 ... N) corresponds to the band of each coupler that is directed through one of the filters $120_{1...N}$.

The RF input signals appearing at the input port through variable attenuator 101 with frequencies falling in the $0^{th}$ band are diverted to the LFSA 116 by means of a diplexer (D)

110. In contrast, signals having frequencies in one of the other bands (i=1 . . . N) couple strongly through a corresponding one of the cascade of couplers $102_{1 \ldots N}$ to filters $120_{1 \ldots N}$. Power remaining in the RF signals as they reach the diplexer 110 is diverted toward a broadband termination where it is absorbed. While in general the frequency bands (i=1 . . . N) of the couplers $102_{1 \ldots N}$ need not be contiguous, continuity of the frequency spectrum renders this property desirable.

The filters $120_{1 \ldots N}$, switches $106_{1 \ldots N}$, amplifiers $122_{1 \ldots N}$, and additional couplers $104_{1 \ldots N}$ provide a selected one of the signals from couplers $102_{1 \ldots N}$ to a first input (RF input) of a single frequency translation device, such as a mixer 100. The frequency translation device can also be a sub-harmonic mixer. Selection of one of the couplers $102_{1 \ldots N}$ is provided by controlling connection of one of the switches $106_{1 \ldots N}$. The off state of the switches $106_{1 \ldots N}$ is made absorptive by proper choice of switch type and off-state termination as illustrated. The filters $120_{1 \ldots N}$ are band-pass filters with a range that substantially eliminates the frequency band of a subsequent filter. The different filter ranges are illustrated by the symbols $F_{1 \ldots N}$. The amplifiers $122_{1 \ldots N}$ are optional, and do have a frequency range like the filters, illustrated by symbols $G_{1 \ldots N}$, substantially covering only the range of their respective connected filter $120_{1 \ldots N}$. Each of the couplers $104_{1 \ldots N}$ has a range corresponding to one of the couplers $102_{1 \ldots N}$ to which it is connected, as illustrated by the respective symbols $L_{1 \ldots N}$. The through path of the couplers $104_{1 \ldots N}$ is connected by an amplifier 124 to the first RF input of mixer 100.

The mixer 100 is a single device in the embodiment of FIG. 3 that provides for down conversion of a selected RF signal to an IF signal for providing to the LFSA 116. A local oscillator (LO) that is synchronized with the LFSA is provided to the second input (LO) of the mixer 100. The mixer 100, thus, converts the RF signal received at its first input to an IF output signal using the LO signal from its second input. The IF output of the mixer 100 is provided through a bandpass filter 126 to remove undesired harmonics, and is then provided through amplifier 128 to a second input of the LFSA 116.

Figure 4:
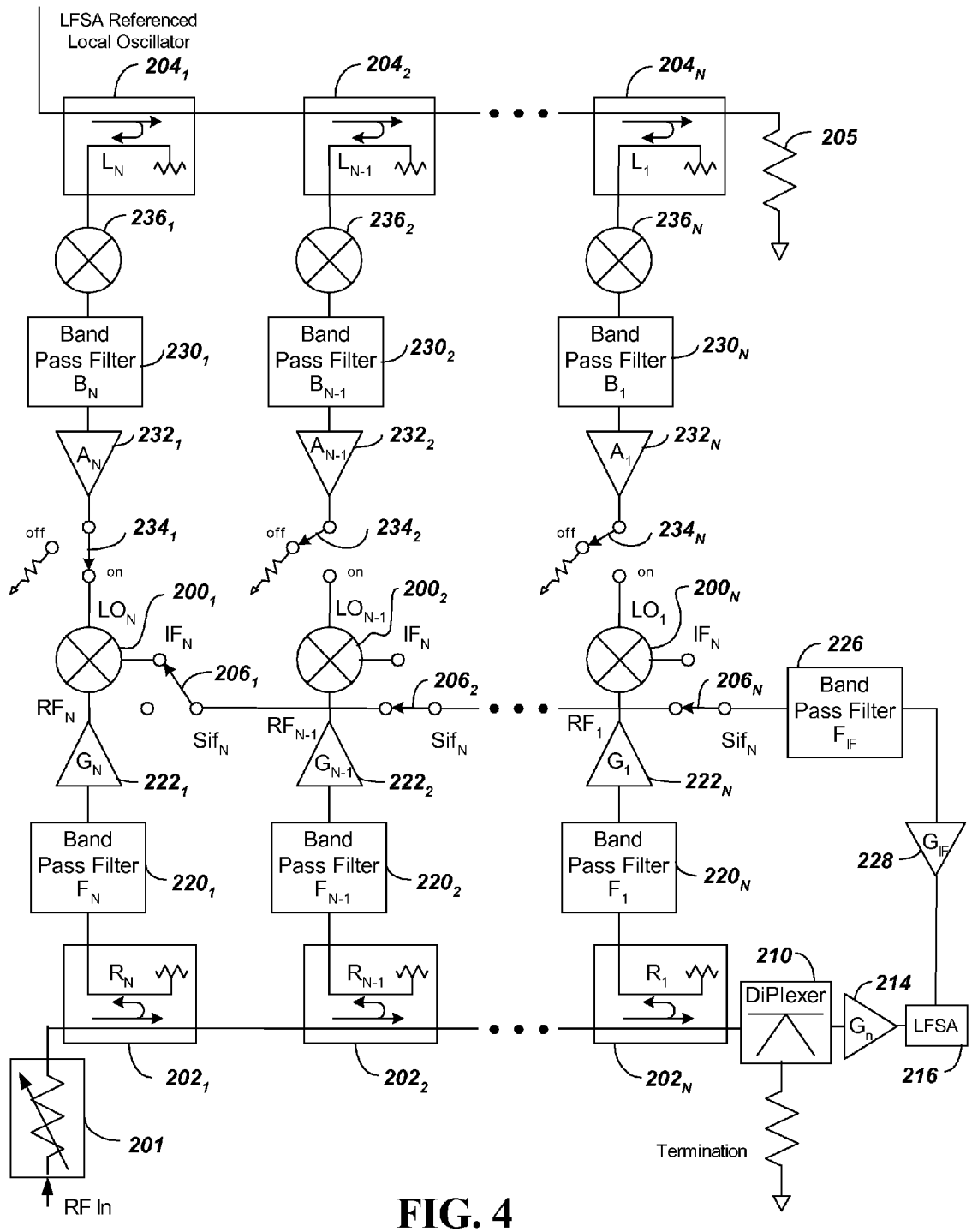
FIG. 4 shows circuitry for extending the bandwidth of a LFSA according to another embodiment of the present invention using an array of couplers tapped onto the RF signal path along with multiple mixers, and IF switches to select one mixer IF output to provide to the LFSA.

FIG. 4 shows circuitry for extending the bandwidth of a LFSA according to another embodiment of the present invention. The circuitry of FIG. 4 uses an array of couplers $202_{1 \ldots N}$ provided in the RF signal path, similar to FIG. 3. Instead of a single mixer as in FIG. 3, however, FIG. 4 uses multiple mixers $200_{1 \ldots N}$ and switches $206_{1 \ldots N}$ to select the output of one of mixers $200_{1 \ldots N}$ to provide the IF output to LFSA 216.

Similar to FIG. 3, in FIG. 4 the frequency spectrum of the RF signal is split into N+1 bands corresponding to the couplers $202_{1 \ldots N}$ and the low-frequency band of the LFSA 216. The range of each coupler $202_{1 \ldots N}$ corresponds to a different one of the N+1 bands with some overlap. A $0^{th}$ band corresponds to the frequency range of the LFSA 216, the $0^{th}$ band being uncommon to all the couplers $102_{1 \ldots N}$ while the $i^{th}$ (i=1 . . . N) corresponds to the band of each coupler that is directed through to one of the filters $220_{1 \ldots N}$.

The RF signals appearing at the input port through variable attenuator 201 with frequencies falling in the $0^{th}$ band are diverted to the LFSA 216 by means of a diplexer (D) 210. In contrast, signals having frequencies in one of the other bands (i=1 . . . N) couple strongly through a corresponding one of the cascade of couplers $202_{1 \ldots N}$ to filters $220_{1 \ldots N}$. Power remaining in the RF signals as they reach the diplexer 210 is diverted toward a termination where it is absorbed. While in general the frequency bands (i=1 . . . N) of the couplers $202_{1 \ldots N}$ need not be contiguous, continuity of the frequency spectrum renders this property desirable.

Signals in the frequency bands (i=1 . . . N) appearing in couplers $202_{1 \ldots N}$ through the filters $220_{1 \ldots N}$ are translated to the IF frequency range of the LFSA 216 using a corresponding one of the mixers $200_{1 \ldots N}$. As in the previous architecture, one frequency bands is active at a time while others are disabled. That is, only one of the LO signals $LO_{1 \ldots N}$ is connected to a corresponding mixer $200_{1 \ldots N}$ while others are terminated by means of switches $234_{1 \ldots N}$ and adjacent resistive terminations. Therefore, the active frequency band dictates the state of LO switches $234_{1 \ldots N}$ and the state of IF switches $206_{1 \ldots N}$.

The filters $220_{1 \ldots N}$ and amplifiers $222_{1 \ldots N}$ act on signals from couplers $202_{1 \ldots N}$ to provide RF signals $RF_{1 \ldots N}$ to individual ones of mixers $200_{1 \ldots N}$. The filters $220_{1 \ldots N}$ are band-pass filters with a range that substantially eliminates the frequency band of a subsequent filter. The different filter ranges are illustrated by the symbols $F_{1 \ldots N}$. The amplifiers $222_{1 \ldots N}$ provide amplification over a similar frequency range as indicated by the symbols $G_{1 \ldots N}$.

LO signals $LO_{1 \ldots N}$ are provided to mixers $200_{1 \ldots N}$ from the output of the second chain of couplers $204_{1 \ldots N}$. The second coupler chain $204_{1 \ldots N}$ connects to mixers $200_{1 \ldots N}$ through bandpass filters $230_{1 \ldots N}$ and amplifiers $232_{1 \ldots N}$. The bandpass filters $230_{1 \ldots N}$ have frequency ranges that substantially eliminate the frequency band of a subsequent filter, as noted by the symbols $B_{1 \ldots N}$, and amplifiers $230_{1 \ldots N}$ provide a similar range as noted by symbols $A_{1 \ldots N}$. Additional frequency multipliers $236_{1 \ldots N}$ can optionally be included to selectively multiply the frequency output of couplers $204_{1 \ldots N}$ if desired. The LO signal is provided through the second coupler chain $204_{1 \ldots N}$ that is referenced to the LFSA 216. LO signals whose frequencies fall outside the bands $L_{1 \ldots N}$ are terminated in resistive load 205.

Selection of one of the outputs of mixers $200_{1 \ldots N}$ as an IF signal to provide to LFSA 216 is controlled by connection of one of the switches $234_{1 \ldots N}$, as well as one of switches $206_{1 \ldots N}$. The switches $234_{1 \ldots N}$ are controlled so that only one output is connected to one of mixers $200_{1 \ldots N}$. Switches $206_{1 \ldots N}$ are controlled so that one of the mixer outputs is then provided through bandpass filter 226 and amplifier 228 to LFSA 216.

The fact that the architectures shown in FIGS. 3-4 are frequency scalable is evident by noting the varying lengths of the coupler arms. Evident also is the fact that the DC path leading from the RF input port to the LFSA shown in the circuit of both FIGS. 3 and 4 is preserved for signals falling in the $0^{th}$ band as a result of frequency diplexing with diplexers 110 and 210.

The chains of couplers in the circuits of FIGS. 3 and 4 can be arranged to reduce frequency dependent loss, to maximize dynamic range or to provide for a desired combination of these goals. To accomplish this, the coupler lengths can be either commensurate or non-commensurate. Further, the spacing between the chained couplers can be either commensurate or non-commensurate. Further, the coupling coefficient of the couplers may or may not differ. By locating high-frequency couplers close to the RF input port, high-frequency ohmic losses can be minimized so as to preserve the high dynamic range of the measurement instrument.

To increase dynamic range and to reduce frequency dependent losses, other components besides the couplers of FIGS. 3 and 4 can be selected appropriately. For example, in one embodiment the bandpass filters can be made tunable so that a user can fine tune dynamic range. The amplifiers can be chosen so that the third-order intercept of the amplifier does not limit the frequency-translation devices. Further, the order of the amplifiers, filters, switches and couplers can be rearranged to improve performance. Further, the frequency translation devices can be made as identical as possible. Also, the frequency multipliers can be made reactive to keep phase noise as close as possible to $20 \log_{10}(N)$, where N is the frequency multiplication coefficient. To reduce frequency-dependent electromagnetic coupling, waveguide channels can be employed to isolate electromagnetically frequency-translation stages, switch stages, or other portions of the circuitry of FIGS. 3 and 4. Finally, attenuators can be used to reduce multiple electromagnetic wave reflections between stages.

Although the present invention has been described above with particularity, this was merely to teach one of ordinary skill in the art how to make and use the invention. Many additional modifications will fall within the scope of the invention, as that scope is defined by the following claims.

What is claimed:

1. An apparatus for extending the operating frequency range of a spectrum analyzer comprising:
    first couplers having through paths connected in series from a RF signal source to a low frequency spectrum analyzer (LFSA), and each having a coupling path terminal;
    a frequency translation device having a first terminal for connecting to a local oscillator (LO), a second RF terminal, and having an output providing an IF signal for connecting to the LFSA;
    second couplers having through paths connected in series from a termination to the RF terminal of the frequency translation device, and having a coupling path terminal;
    filters each having an input connected to the coupling terminal of one of the first couplers, and having an output; and
    switches each having a primary terminal connected to the output of one of the filters and having a switching terminal for alternatively connecting to the coupling terminal of one of the second couplers and to a termination, the switches being controlled to connect the output of one of the first couplers through one of the second couplers to the RF input of the frequency translation device.

2. The apparatus of claim 1,
    wherein the first couplers and respective ones of the second couplers to which they are connected each provide a successively higher operating frequency range.

3. The apparatus of claim 1, further comprising a diplexer connecting the through path of the first couplers to the LFSA, and having an additional terminal connected to a transmission line termination.

4. The apparatus of claim 1, further comprising:
    a bandpass filter for connecting the output of the mixer to the LFSA.

5. The apparatus of claim 1, wherein the frequency translation device comprises one of a mixer and a harmonic sampler.

6. The apparatus of claim 1, further comprising amplifiers each connecting the switching terminal of one of the switches to the coupling path terminal of one of the second couplers.

7. The apparatus of claim 1, wherein the filters provide different passband frequency ranges.

8. The system of claim 1 wherein the LO is synchronized with the LFSA.

9. An apparatus for extending the operating frequency range of a spectrum analyzer comprising:
    first couplers having through paths connected in series from a RF signal source to an RF input of a low frequency spectrum analyzer (LFSA), and each having a coupling path terminal;
    second couplers having through paths connected in series from the LO signal port to a termination, and having a coupling path terminal;
    first filters each having an input connected to the coupling terminal of one of the first couplers, and having an output;
    second filters each having an input connected to the coupling terminal of one of the second couplers, and having an output;
    frequency translation devices each having a first input connected to an output of a respective one of the first filters, a second input connected to an output of a respective one of the second filters, and having an output providing an IF signal;
    switches for selectively connecting the output of one of the mixers to an IF input of the LFSA.

10. The apparatus of claim 9, further comprising a diplexer connecting the through path of the first couplers to the RF input of the LFSA, and having an additional terminal connected to a transmission line termination.

11. The apparatus of claim 9, wherein the frequency translation devices each comprise one of a mixer and a harmonic sampler and a multiplier.

12. The apparatus of claim 9, further comprising:
    second switches for selectively connecting the output of the second filters to the second input of the frequency translation devices.

13. The apparatus of claim 9,
    wherein the first couplers each provide a successively higher bandpass frequency range.

14. The apparatus of claim 9,
    wherein the second couplers each provide a successively higher bandpass frequency range.

15. The system of claim 9, wherein the translation devices are substantially identical.

16. The system of claim 9, wherein a LO generator is connected to the LO signal port and the LO reference generator is synchronized with the LFSA.

17. An apparatus for extending the operating frequency range of a spectrum analyzer comprising:
    first couplers having through paths connected in series from a RF signal source to an RF input of a low frequency spectrum analyzer (LFSA), and each having a coupling path terminal;
    at least one frequency translation device having an output terminal for providing an IF signal for connecting to an IF input of the LFSA, and having input terminals; and
    second couplers for directing at least one of a local oscillator signal and the coupling terminal of one of the first couplers to one of the input terminals of the at least one frequency translation devices, wherein the other of the local oscillator signal and the coupling terminal of one of the first couplers is provided to another input of the at least one frequency translation devices.

18. The apparatus of claim 17, further comprising:
    filters each having an input connected to the coupling terminal of one of the first couplers, the filters providing different passband frequency ranges.

19. The apparatus of claim 18, wherein the filters are tunable.

20. The system of claim 17, wherein the at least one frequency translation device comprises one of a fundamental and a sub-harmonic device.

21. The system of claim 17, further comprising a diplexer having a first to second terminal path connecting the through path of the first couplers to the second terminal of the LFSA, and further comprising a third terminal connected to a DC coupling termination.

* * * * *